(12) United States Patent
Coldren et al.

(10) Patent No.: US 6,631,154 B2
(45) Date of Patent: Oct. 7, 2003

(54) METHOD OF FABRICATING A DISTRIBUTED BRAGG REFLECTOR HAVING ENHANCED THERMAL AND ELECTRICAL PROPERTIES

(75) Inventors: Larry A. Coldren, Santa Barbara, CA (US); Guilhem Almuneau, Aesch Bei Birmensdorf (CH)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/935,000

(22) Filed: Aug. 21, 2001

(65) Prior Publication Data

US 2002/0024988 A1 Feb. 28, 2002

Related U.S. Application Data

(60) Provisional application No. 60/262,866, filed on Jan. 18, 2001, provisional application No. 60/227,165, filed on Aug. 22, 2000, provisional application No. 60/227,161, filed on Aug. 22, 2000, and provisional application No. 60/226,866, filed on Aug. 22, 2000.

(51) Int. Cl.⁷ .................. H01S 5/187; H01L 21/20
(52) U.S. Cl. .................. 372/96; 372/45; 438/22; 438/29
(58) Field of Search .................. 372/45, 46, 96; 438/22, 29

(56) References Cited

U.S. PATENT DOCUMENTS

| 4,829,347 A | 5/1989 | Cheng et al. |
| 5,045,499 A | 9/1991 | Nishizawa et al. |
| 5,082,799 A | 1/1992 | Holmstrom et al. |
| 5,245,622 A | 9/1993 | Jewell et al. |
| 5,251,225 A | 10/1993 | Eglash et al. |
| 5,293,392 A | 3/1994 | Shieh et al. |
| 5,343,487 A | 8/1994 | Scott et al. |
| 5,358,880 A | 10/1994 | Lebby et al. |
| 5,392,307 A | 2/1995 | Sugiyama et al. |
| 5,416,044 A | 5/1995 | Chino et al. |
| 5,422,901 A | 6/1995 | Lebby et al. |
| 5,468,343 A | 11/1995 | Kitano |
| 5,568,504 A | 10/1996 | Köck et al. |
| 5,588,995 A | 12/1996 | Sheldon |
| 5,631,472 A | 5/1997 | Cunningham et al. |
| 5,693,180 A | 12/1997 | Furukawa et al. |
| 5,719,891 A | 2/1998 | Jewell |
| 5,719,892 A * | 2/1998 | Jiang et al. ................ 372/45 |
| 5,877,038 A | 3/1999 | Coldren et al. |
| 5,974,073 A | 10/1999 | Cannard et al. |
| 5,985,683 A | 11/1999 | Jewell |
| 5,991,326 A | 11/1999 | Yuen et al. |
| 6,021,147 A | 2/2000 | Jiang et al. |
| 6,057,560 A | 5/2000 | Uchida |
| 6,061,380 A | 5/2000 | Jiang et al. |
| 6,127,200 A | 10/2000 | Ohiso et al. |
| 6,207,973 B1 | 3/2001 | Sato et al. |
| 6,306,672 B1 * | 10/2001 | Kim ........................ 438/22 |
| 6,365,427 B1 * | 4/2002 | Gauggel et al. ............ 438/22 |

FOREIGN PATENT DOCUMENTS

| JP | 57026492 A | 2/1982 |
| WO | WO 98/07218 | 2/1998 |

OTHER PUBLICATIONS

C. Starck, "Long Wavelength VCSEL with Tunnel Junction and Metamorphic A1As/GaAs Conductive DBR", LEOS '99: IEEE Lasers and Electro–Optics Society 1999 12th Annual Meeting, Nov. 1999, vol. 1, pp. 139–140, especially Figure 1.

(List continued on next page.)

Primary Examiner—James Davie

(57) ABSTRACT

A distributed Bragg reflector (DBR) for a vertical cavity surface emitting laser (VCSEL) includes alternating layers of different semiconductor materials to improve thermal and electrical characteristics for the VCSEL. Use of particular materials reduces the thermal resistivity of the DBR and allows heat to dissipate quickly during operation of the VCSEL.

57 Claims, 7 Drawing Sheets

OTHER PUBLICATIONS

K.D. Choquette et al., "Room Temperature Continuous Wave InGaAsN Quantum Well Vertical–Cavity Lasers Emitting at 1.3 μm", Electronics Letters, Aug. 3, 2000, vol. 36, No. 16, pp. 1388–1390.

K.A. Black et al., "Double–fused 1.5μm vertical cavity lasers with record high $T_o$ of 132K at room temperature" Electronics Letters, vol. 34, pp. 1947–1949, Oct. 1998.

V. Jayaraman et al., "Uniform threshold current, continuous–wave, singlemode 1300nm vertical cavity lasers from 0 to 70°C," Electronics Letters, vol. 34, pp. 1405–1407, Jul. 1998.

M. Orsiefer et al, "Submilliamp long–wavelength InP–based vertical–cavity surface–emitting laser with stable linear polarization," Electronics Letters, vol. 36, pp. 1124–1126, Jun. 2000.

W. Yuen et al., "High–performance 1.6μm single–epitaxy top–emitting SCSEL," Electronics Letters, vol. 36, pp. 1121–1123, Jun. 2000.

O. Blum et al., "Electrical and optical characteristics of AlAsSb/GaAsSb distributed Bragg reflectors for surface emitting lasers," Appl. Phys. Lett., pp. 3233–3235, Nov. 1995.

O. Blum et al, "Highly reflective, long wavelength AlAsSb/GaAsSb distributed Bragg reflector grown by molecular beam epitaxy on InP substrates," Appl. Phys. Lett., vol. 66, pp. 329–331, Jan. 1995.

J. Boucart et al., "I–mW CW–RT Monolithic VCSEL at 1.55μm," IEEE Photonics Technology Letters, vol. 11, pp. 629–631 Jun. 1999.

T. Uchida et al, "CBE Grown 1.5 μm GaInAsP–InP Surface Emitting Lasers," IEEE Journal of Quantum Electronics, vol. 29, pp. 1975–1980 Jun. 1993.

J. Piprek et al., "Minimum temperature sensitivity of 1.55 μm vertical–cavity lasers at—30 nm gain offset," Applied Physics Letters, vol. 72, pp. 1814–1816 Apr. 1998.

E. Hall et al., "Increased Lateral Oxidation Rates of AlInAs on InP using Short–Period Superlattices," Electronic Materials Conference, Journ. Electron Materials, vol. 29, No. 9, pp. 1100–1104 (2000) (No Month).

E.R. Hegblom et al., "Small efficient vertical cavity lasers with tapered oxide apertures," Electronics Letters, vol. 34, pp. 895–896 Apr. 1998.

G. Almuneau et al., "Accurate control of Sb composition in AlGaAsSb alloys on InP substrates by molecular beam epitaxy," Journal of Crystal Growth, vol. 208, pp. 113–116 (2000) (No Month).

J.K. Kim, et al., "Room–temperature, electrically–pumped multiple–active region VCSELs with high differential efficiency at 1.55 μmμ," Electronics Letters, vol. 35, pp. 1084–1085, No. 13, pp. 1–2 Jun. 1999.

M. Sugimoto, et al., "Surface emitting devices with distributed Bragg reflectors grown by highly precise molecular beam epitaxy," Journal of Crystal Growth, vol. 127, pp. 1–4, (1993) (No Month).

M. Yano, et al., "Time–resolved reflection high energy electron diffraction analysis for atomic layer depositions of GaSb by molecular beam epitaxy," Journal of Crystal Growth, vol. 146, pp. 349–353 (1995) (No Month).

M.G. Peters et al., "Band–gap engineered digital alloy interfaces for lower resistance vertical–cavity surface–emitting lasers," Appl. Phys. Lett., vol. 63, pp. 3411–3413 Dec. 1993.

E. Hall et al., "Electrically–pumped, single–epitaxial VCSELs at 1.55 μm with Sb–based mirrors," Electronics Letters, vol. 35, pp. 1–2, Aug. 1999.

G. Almuneau, et al., "Improved electrical and thermal properties of InP–AlGaAsSb Bragg mirrors for long–wavelength vertical–cavity lasers," IEEE Photonics Technology Letters, vol. 12, pp. 1322–1324 May/Jun. 2000.

E. Hall et al., "Selectively Etched Undercut Apertures in AlAsSb–Based VCSELs," submitted to IEEE Photonics Technology Letters, vol. 13, pp. 97–99 Feb. 2001.

G. Almuneau et al., "Molecular beam epitaxial growth of monolithic 1.55 μm vertical cavity surface emitting lasers with AlGaAsSb/AlAsSb Bragg mirrors," Journal of Vacuum Science & Technology B, vol. 18, pp. 1601–1604, Oct. 2000.

J.W. Scott et al, "High Efficiency Submilliamp Vertical Cavity Lasers with Intracavity Contacts," IEEE Photonics Technology Letters, vol. 6, pp. 678–680 Jun. 1994.

R.N. Naone, and L.A. Coldren, "Tapered Air Apertures for Thermally Robust VCL Structures," IEEE Photonics Technology Letters, vol. 11, pp. 1339–1341 Nov. 1999.

J.K. Kim et al, "Epitaxially–stacked multiple–active region 1.55 μm lasers for increased differential efficiency," Applied Physics Letters, vol. 74, pp. 3251–3253 May 1999.

* cited by examiner

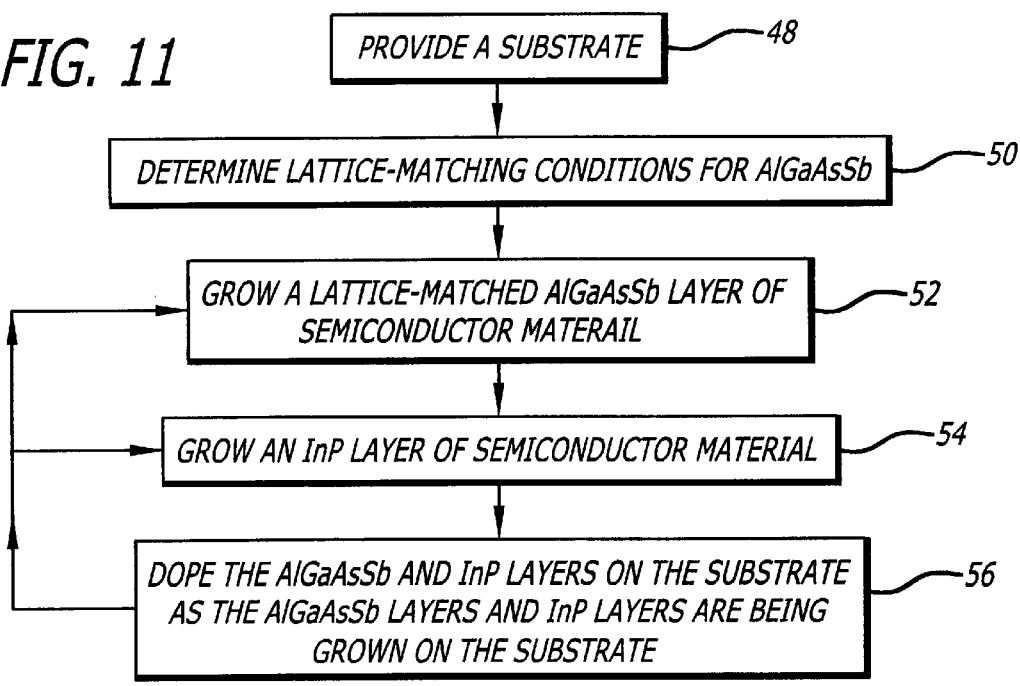
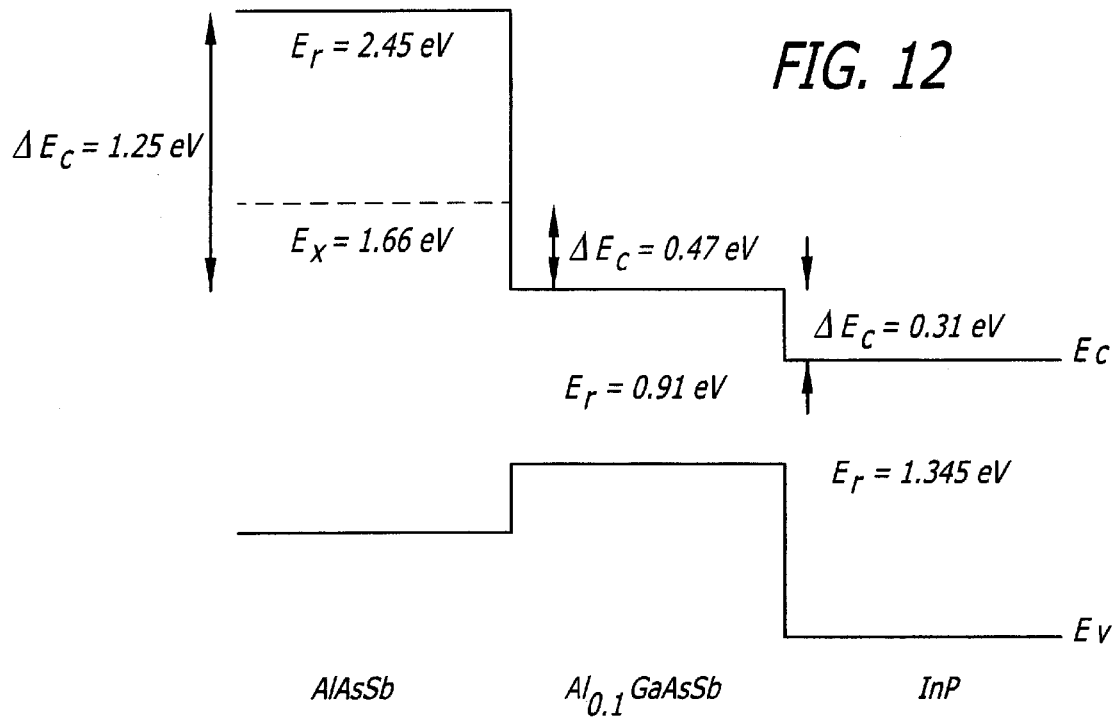

| MATERIAL | MEASURED THERMAL CONDUCTIVITY (W/m.K) | VALUE FROM THE LITERATURE (W/m.K) | REFERENCE |
| --- | --- | --- | --- |
| AlGaAsSb BULK LAYER | 3.16 | - | THIS WORK |
| AlAsSb BULK LAYER | 4.18 | - | THIS WORK |
| InP BULK LAYER | 71 | 68 | [14] |
| AlGaAsSb/AlAsSb DBR | 3.62 | 5.6* | [15] |
| AlGaAsSb/InP DBR | 6.52 | - | THIS WORK |

METHOD OF FABRICATING A DISTRIBUTED BRAGG REFLECTOR HAVING ENHANCED THERMAL AND ELECTRICAL PROPERTIES

The contents of this application are related to those provisional applications having Ser. Nos. 60/227,165, 60/227,161, and 60/226,866, filed Aug. 22, 2000, and a provisional application having Ser. No. 60/262,866 filed January 18, 2001. The present application claims priority to these related provisional patent applications and their contents are hereby incorporated by reference in their entirety into the present disclosure. The contents of this application are also related to serial nonprovisional patent applications being filed concurrently herewith. These nonprovisional patent applications are hereby incorporated by reference in their entirety and have the following serial numbers: 09/935,009, 09/935,012, 09/934,789, 09/935,122, 09/935,352, 09/934,781, 09/935,279, 09/934,791, all filed on Aug. 21, 2001 and are under common obligation of assignment with this application.

This invention was made with the support of the United States Government under Grant No. MDA972-98-1-0001, awarded by the Department of Defense (DARPA). The Government has certain rights in this invention under 35 U.S.C. §202.

BACKGROUND OF THE INVENTION

1. Field of the Invention

The invention relates in general to a vertical cavity surface emitting laser (VCSEL). More particularly, the invention relates to growth methods and structures for distributed Bragg reflectors (DBRs) utilized in VCSELs.

2. General Background and State of the Art

Semiconductor lasers are widely used in optical applications, in part because semiconductor fabrication techniques are relatively inexpensive and yield reliable, consistent results. Also, they are easily packaged into current microelectronics. A relatively new class of semiconductor lasers, vertical cavity surface emitting lasers (VCSELs), has been developed through the evolution of this technology. Unlike conventional edge emitting lasers that emit light in a direction parallel to the semiconductor substrates where the lasers are formed, VCSELs have optical cavities perpendicular to the substrate, and thus emit optical radiation in a direction perpendicular to the substrate. In addition to various performance and application-adaptable improvements created thereby, VCSELs simply require reduced complexity in their fabrication and testing, as compared to conventional edge emitting semiconductor lasers.

Vertical cavity surface emitting lasers (VCSELs) have been proven to be solutions for low-cost transmitters for high-speed data communications at 980 nm and 850 nm and have shown great potential for cost-effective telecommunication systems at longer wavelengths as well, such as 1.55 $\mu$m and 1.3 $\mu$m. These long wavelength VCSELs will satisfy increasing demand for high speed data transmission over tens of kilometers. 10-Gigabit Ethernet is one example, which requires inexpensive transmitters with a data rate of 10 G bit per second (Gbps) and up to 40 km reach over single-mode fiber.

VCSELs are semiconductor lasers having a semiconductor layer of optically active material, such as gallium arsenide or indium gallium arsenide or the like, sandwiched between highly-reflective layers of metallic material, dielectric material, epitaxially-grown semiconductor dielectric material or combinations thereof, most frequently in stacks. These stacks are known as distributed Bragg reflectors, or DBRs. DBRs are used to reflect emitted light back into the active material of a VCSEL. As is conventional, one of the mirror stacks is partially reflective so as to pass a portion of the coherent light built up in the resonating cavity formed by the mirror stack/active layer sandwich. Laser structures require optical confinement and carrier confinement to achieve efficient conversion of pumping electrons to stimulated photons (a semiconductor may lase if it achieves population inversion in the energy bands of the active material.)

The development of vertical-cavity surface-emitting lasers (VCSELs) at the telecommunications-important wavelength of 1.55 $\mu$m has been hindered by the absence of a substrate that is suitable for both technologically-developed distributed Bragg reflectors (DBRs) and quantum well active regions. In fact, despite the demonstration of VCSELs grown on a single substrate, the best results have been obtained through the fusion of InP-based active regions and AlGaAs-based DBRs.

To overcome mirror limitations on InP, several groups have examined AlGaAsSb-based DBRs, which have a refractive index contrast that is similar to AlGaAs-based DBRs at this wavelength. The high index contrast leads to a lower penetration depth than traditional InGaAsP-based DBRs and, therefore, implies lower optical loss in the structure. Only optically-pumped VCSELs using such DBRs, however, have been demonstrated.

While both short wavelength and long wavelength VCSELs have proven to offer excellent solutions for many applications in the evolving optical applications marketplace, they also have certain limitations and drawbacks that are well known in the art. Some of these drawbacks are inherent to the conventional materials used in the fabrication of Bragg mirrors for VCSELs grown on InP substrates. For example, the accuracy and reproducibility of an As, Sb composition in a AlGaAsSb semiconductor system is very difficult to achieve in DBR fabrication. While such materials have conventionally been considered and used as the best selection for the mirrors, they do not effectively optimize high reflectivity, good electrical conduction and low thermal resistance.

INVENTION SUMMARY

The present invention provides a method of growing a distributed Bragg reflector for use in a VCSEL using molecular beam epitaxy. The present invention also provides a method of fabricating a distributed Bragg reflector (DBR) in which the amount of particular semiconductor materials used in the DBR are controlled in the molecular beam epitaxy process.

The present invention provides a DBR for use in vertical cavity surfave emitting laser (VCSEL) having an Sb-based semiconductor material. The present invention further provides a method of enhancing thermal properties in a DBR by growing AlGaAsSb layers and InP layers on a substrate to form the DBR. A method of fabricating DBRs using these two types of layers is also provided.

One aspect of the present invention provides a method for controlling material composition in a distributed Bragg reflector. The method includes applying reflection high-energy electron diffraction (RHEED) oscillations in molecular beam epitaxy to a substrate, measuring the intensity of antinomy (Sb) atoms present in the substrate in response to the RHEED oscillations, and calibrating the amount of Sb to be incorporated into the susbtrate, with the amount depending upon the frequency of the RHEED oscillations induced by the Sb atoms.

Accordingly, one object of the present invention is to provide a method of controlling material composition in a distributed Bragg reflector for use in a VCSEL. It is another object of the present invention to provide a method of fabricating a distributed Bragg reflect for use in a VCSEL incorporating the above method of controlling material composition. It is still another object of the present invention to provide a VCSEL and method of fabrication of a VCSEL which enhances the thermal and reflective characteristics of the VCSEL.

BRIEF DESCRIPTION OF THE DRAWINGS

FIG. 11 is a flowchart overview of the process of forming a DBR using InP;

FIG. 12 is a plot of differences in band alignment between arsenide-antimonide (AsSb) alloys and InP;

DETAILED DESCRIPTION OF THE EMBODIMENTS

Figure 1:
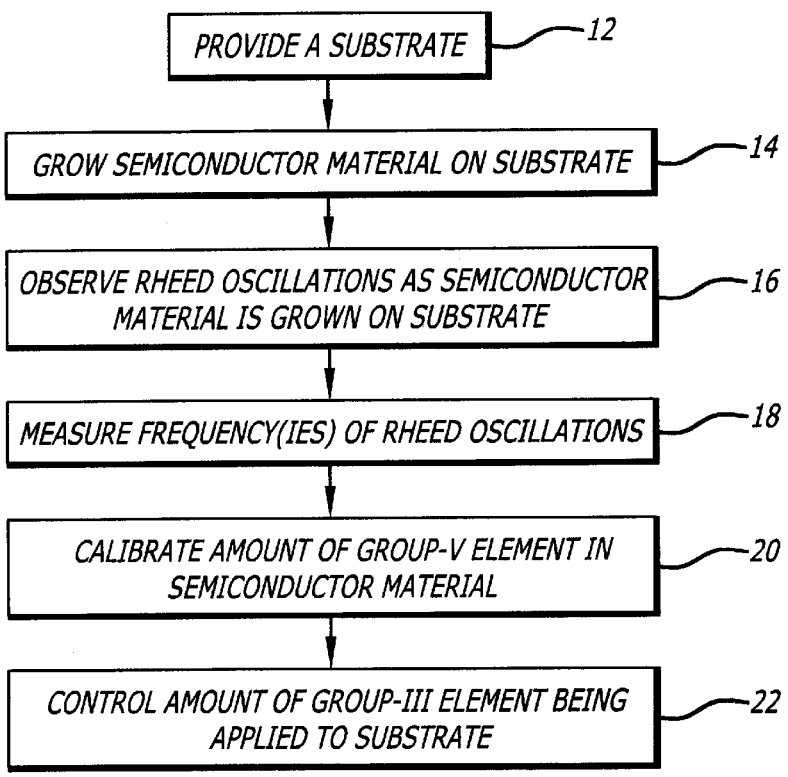
FIG. 1 is a flowchart overview of the process of forming a DBR using one embodiment of the present invention.

FIG. 1 is a flowchart describing the process of growing a DBR in one embodiment. Block 12 shows the step of providing a substrate on which DBR materials are grown. Block 14 shows the step of growing semiconductor material on the substrate. As described herein, molecular beam epitaxy is used in this embodiment to grow the materials on the substrate. Block 16 shows the step of observing RHEED oscillations to monitor the composition of group V elements such as antimony (Sb) in the semiconductor material. The RHEED oscillations occur simultaneously as semiconductor material is being grown on the substrate. Growth continues as measurements are taken of the RHEED oscillations.

The RHEED oscillations are used to monitor the amount of a group V element's atoms being to the substrate. Block 18 shows the next step, in which measurements of the oscillation frequencies are taken and used to control the amounts of the group V elements incorporated into the semiconductor material. Additionally, the RHEED oscillations are used to monitor the amount of group III elements such as Ga. A valve or other control mechanism, such as temperature, is used to control the rate of Sb reaching the substrate. Frequencies of the RHEED oscillations indicate the valve setting to control the composition rate of Sb. Block 20 shows the step of calibrating the amount of group V element-based material based upon the measurements taken in Block 18 and as described herein.

As semiconductor materials are being applied to the substrate, Ga and Sb are simultaneously hitting the substrate. However, because it is desirable to control the amount of Sb (or another similar group V element such as arsenic (As)), the flow of Sb must monitored. Beginning with a condition in which there are fewer Ga atoms on the substrate than there are Sb atoms, oscillations registering a frequency change will occur when the amount of Ga atoms exceeds the amount of Sb atoms. Because it is the incorporation rate of the group V, or Sb atoms that are being controlled, a shutter is used to limit the flow of Ga atoms to the substrate when Ga atoms begin to exceed Sb atoms, since too many Ga atoms can swamp the process of accurately controlling Sb composition. This step of controlling the amount of Ga atoms hitting the substrate is shown in Block 22 of FIG. 1. This process of determining valve settings for proper Sb incorporation rates, and controlling the flow of Ga atoms to measure the frequency of oscillations, repeats until an appropriate composition rate of Sb has been reached.

In the present invention, all the growths of arsenide-antimonide compounds on InP substrates have been made using calibrations at a substrate temperature of 470° C. The composition of Sb in the $Al_xGa_{1-x}As_{1-y}Sb_y$ layers is set with regard to the total group-III growth rate. The modifications of growth rates according to the different atoms surface density between GaAs, GaSb and InP are also contemplated, since the calibrations were done on GaAs and GaSb, and the grown layer has the same lattice as InP. In order to maintain a V/III ratio higher than unity, the As flux is always slightly higher than the calibrated value for 1-y As composition.

Figure 2:
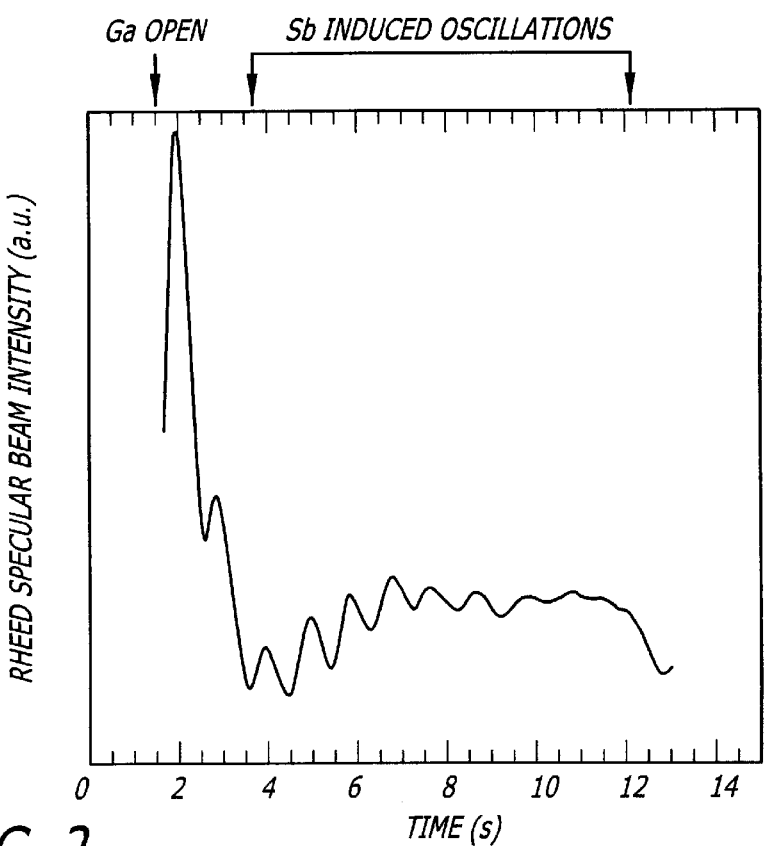
FIG. 2 is a plot of the intensity of RHEED oscillations over time when induced by Sb atoms on a substrate.

FIG. 2 is a plot of frequencies of group-V induced reflection high-energy electron diffraction (RHEED) oscillations 10 used to monitor the incorporation of Sb and As in ternary compounds GaAsSb and AlAsSb as well as the quaternary compound AlGaAsSb. The calibration of the group-V composition is achieved by correlating the Sb incorporation rate with beam equivalent pressure (BEP). An equivalent in situ technique using gas-source molecular beam epitaxy (MBE) is also used to control the group-V compositions of InGaAsP alloys.

Substrate growths are performed in an MBE system equipped with solid source cracking effusion cells producing $As_2$ and $Sb_2$ species on the surface. Conventional RHEED oscillations of group-III species under $As_2$ overpressure are applied on a GaAs substrate to calibrate the growth rates. The Sb and As incorporation rates have been measured also by RHEED oscillations while maintaining an overpressure of Ga during the growth. When an excess of the group-III element is formed at the surface, for example by growth using a high III/V flux ratio, the oscillation period corresponds to the growth of a monolayer, but it is not related to the group-III element flux. Instead it relates to the group-V flux as a product of this flux and the sticking coefficient of the group-V element. The As-induced oscillations have been observed on GaAs layers, and on the same substrate the Sb-induced RHEED oscillations have been performed on a thick totally smooth GaSb layer. FIG. 2 shows an example of such Sb-induced RHEED oscillations at a substrate temperature of 420° C. Before t=1.5 s the surface is under Sb flux, and at t=1.5 s the Ga shutter is opened. The behavior of the RHEED intensity is characteristic of a group-III stabilized surface: the specular beam brightness drops rapidly during the first few monolayers and oscillates with a shorter period than the following Sb-induced oscillations. At t=4 s the oscillations caused by the Sb atoms begin while being rapidly damped due to the degradation of the Ga-stabilized surface.

Molecular beam epitaxy is a method of growing high-purity epitaxial layers of compound semiconductors. It has evolved into a popular technique for growing group III–V compound semiconductors as well as several other materials. MBE can produce high-quality layers with very abrupt interfaces and good control of thickness, doping, and composition. Because of the high degree of control possible with MBE, it is a valuable tool in the development of sophisticated electronic and optoelectronic devices.

In MBE, the constituent elements of a semiconductor in the form of "molecular beams" are deposited onto a heated crystalline substrate to form thin epitaxial layers. The "molecular beams" are typically from thermally evaporated elemental sources, but other sources include metal-organic group III precursors (MOMBE), gaseous group V hydride or organic precursors (gas-source MBE), or some combination (chemical beam epitaxy or CBE). To obtain high-purity layers, it is critical that the material sources be extremely pure and that the entire process be done in an ultra-high vacuum environment. Another important feature is that growth rates are typically on the order of a few Å/s and the beams can be shuttered in a fraction of a second, allowing for nearly atomically abrupt transitions from one material to another.

Calibration of the growth rate is essential for the proper tuning of resonant-cavity devices. There are several in-situ techniques which can be used in MBE. One way to measure the growth rate is to use the BEP gauge. This measurement is dependent on factors such as the geometry of the system and ionization efficiency of the material being measured, but for a given system and material, the BEP reading is proportional to the flux at the sample surface and hence the growth rate. Unlike other techniques, a BEP measurement does not require that any epitaxial layers be grown. Growing epitaxial layers requires an approximate knowledge of the flux beforehand, so the BEP is particularly useful for effusion cells which are being used for the first time. For the Varian Gen II, a BEP reading in the mid to high $10^{-7}$ Torr range gives Ga growth rates of about 1 $\mu$m/hour. However, the technique is not a direct measure of the growth rate, so some other in-situ or ex-situ technique must still be used to relate the BEP to a growth rate.

One such technique includes RHEED intensity oscillations, which are used as an accurate, quick, direct measure of the growth rates in MBE. When growth is initiated on a smooth GaAs surface, the intensity of the RHEED pattern, especially the specular reflection, starts to oscillate. The oscillation frequency corresponds to the monolayer growth rate, where a monolayer (ML) is the thickness of one full layer of Ga and one full layer of As atoms. When a layer starts it is smooth and the specular spot is bright, but as the layer nucleates, islands form on the surface, and the specular spot dims. As the layer finishes, the islands coalesce into a flat layer, and the specular spot intensity increases. The oscillation of the specular spot intensity has been attributed to the oscillating roughness of the layers changing the diffuse scattering, but the incident angle dependence of the oscillations suggest that interference between electrons scattering from the underlying layer and the partially grown layer contribute to these oscillations.

Figure 3:
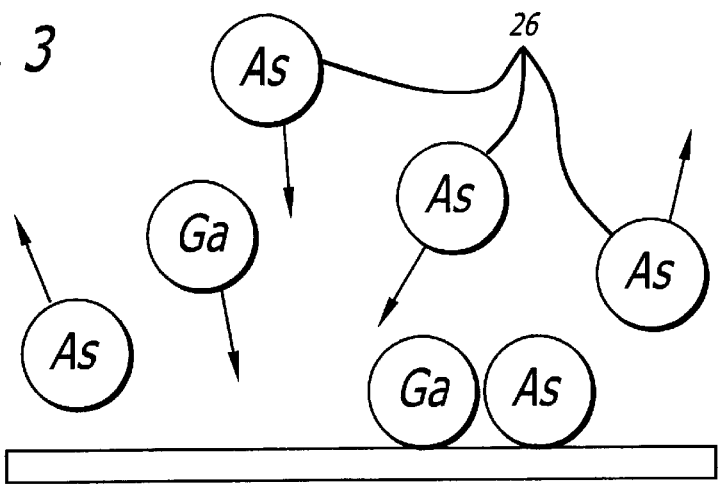
FIG. 3 is a diagrammatic representation of atoms on a substrate during standard molecular beam epitaxy.
Figure 4:
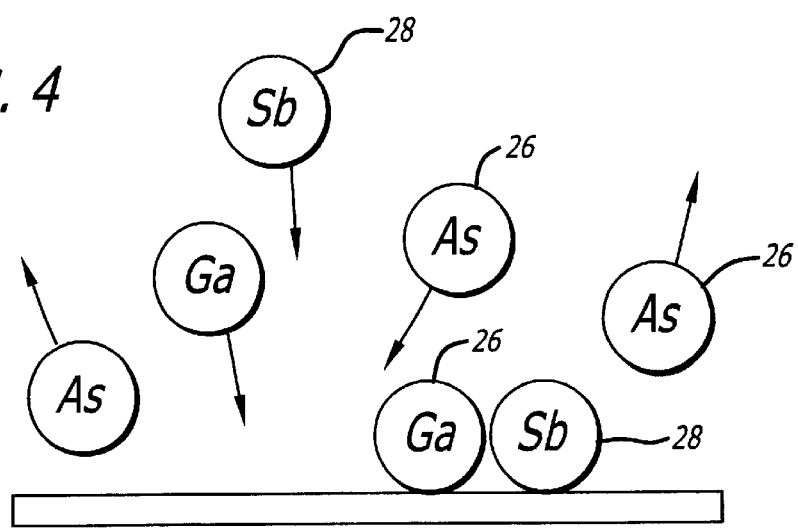
FIG. 4 is a diagrammatic representation of atoms on a substrate during mixed group V molecular beam epitaxy.

FIG. 3 and FIG. 4 are diagrammatic representations of atoms 26 on a substrate. FIG. 3 shows the atoms 26 during standard molecular beam epitaxy, while FIG. 4 shows the atoms 26 during mixed group V molecular beam epitaxy including Sb atoms 28. MBE typically utilizes group V overpressure and assumes that all group III elements will stick. However, when two group V elements (such as As and Sb) are included in the overpressure, the composition must be determined as described herein.

Figure 5:
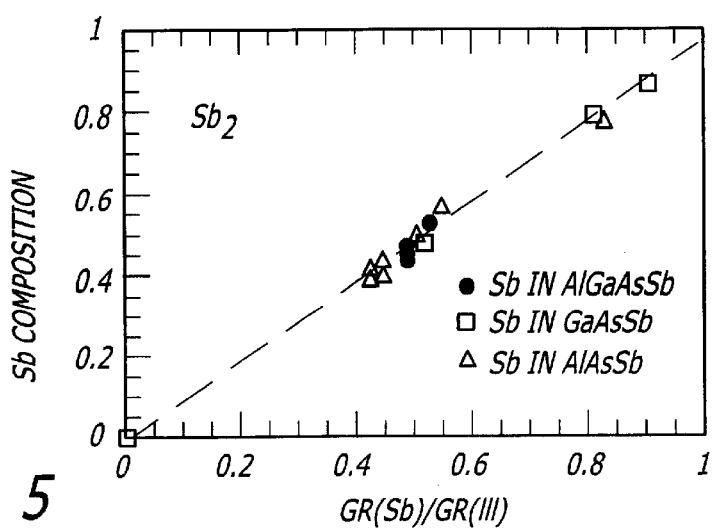
FIG. 5 is a plot of Sb composition in GaAsSb, AlAsSb, and GaAsSb layers as a function of calibrated incorporation rates of Sb normalized with the incorporation rate of Ga.

FIG. 5 is a plot showing the resulting Sb composition measured in GaAsSb, AlAsSb and AlGaAsSb layers grown on InP as a function of the Sb incorporation rate calibrated as described above. Some of these layers are near to InP lattice-matched compositions ($x_{sb} \approx 0.5$) and other growths were performed with $x_{sb} \approx 0.8$. Over the whole composition range the experimental Sb composition depends linearly on the normalized Sb flux as y≅x. The mean deviation of Sb composition from the fit is 0.0186 (maximum deviation= 0.039). The best linearly dependent fit can be obtained with y=1.4x and a mean deviation of 0.0095 (maximum deviation=0.02).

Figure 6:
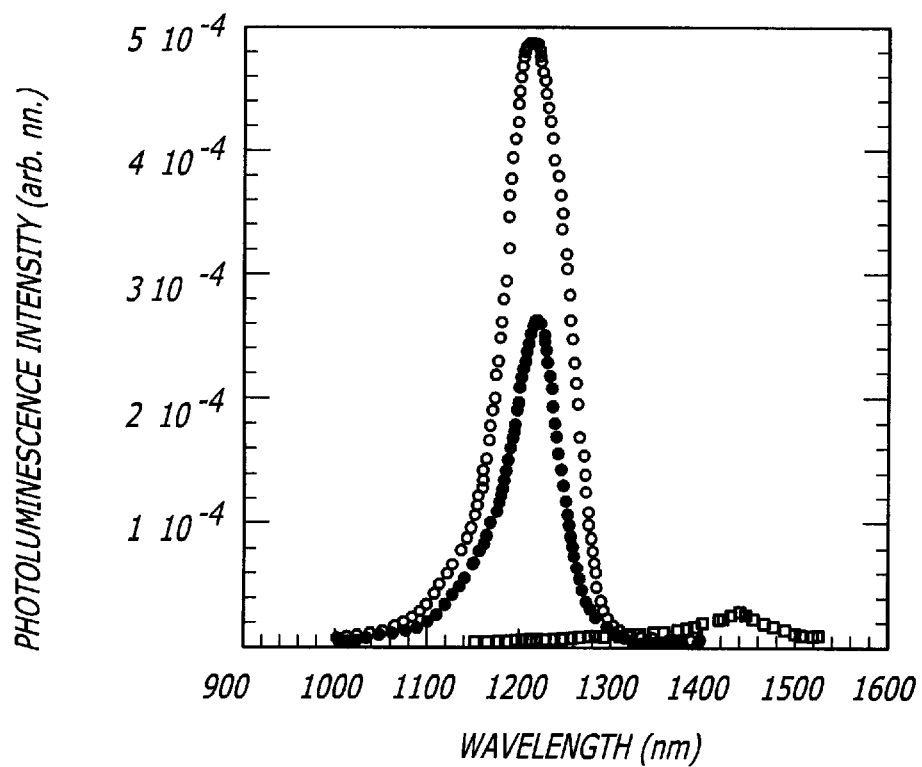
FIG. 6 is a plot of the room-temperature photoluminescence spectra of AlGaAsSb/AlAsSb DBRs and AlGaInAs/AlAsSb DBRs.

In order to demonstrate the good quality of the AlGaAsSb layers, two DBRs containing 10.5 periods of $Al_{0.2}Ga_{0.8}AsSb/AlAsSb$ were grown on InP. The main difference between the mirrors is that one was grown with $Al_{0.2}GaAsSb$ quaternary bulk layers and the other with a digital-alloy $(AlAsSb)_{0.2}(GaAsSb)_{0.8}$. By using such digital alloys we can eliminate growth pauses at each mirror interface because of group-III cell temperature changes when only one Al cell is available o the MBE system. FIG. 6 is a plot of photoluminescence measurements at room temperature performed on both AlGaAsSb/AlAsSb DBRs and AlGaInAs/AlAsSb DBRs. The signals measured for AlGaAsSb in the mirrors are very intense but the digital quaternary alloy shows more intensity than the analog AlGaAsSb. The full-widths at half maximum are respectively 65 meV for the digital quaternary alloy and 54 meV for the analog one. As a comparison the photoluminescence signal observed for a 10.5 periods Be-doped AlGaInAs/ AlAsSb is also depicted in FIG. 6. The wavelength at the maximum of both peaks is 1222 nm which corresponds to the calculated band-gap wavelength of $Al_{0.17}Ga_{0.83}AsSb$ close to the 20% Al expected.

Figure 7:
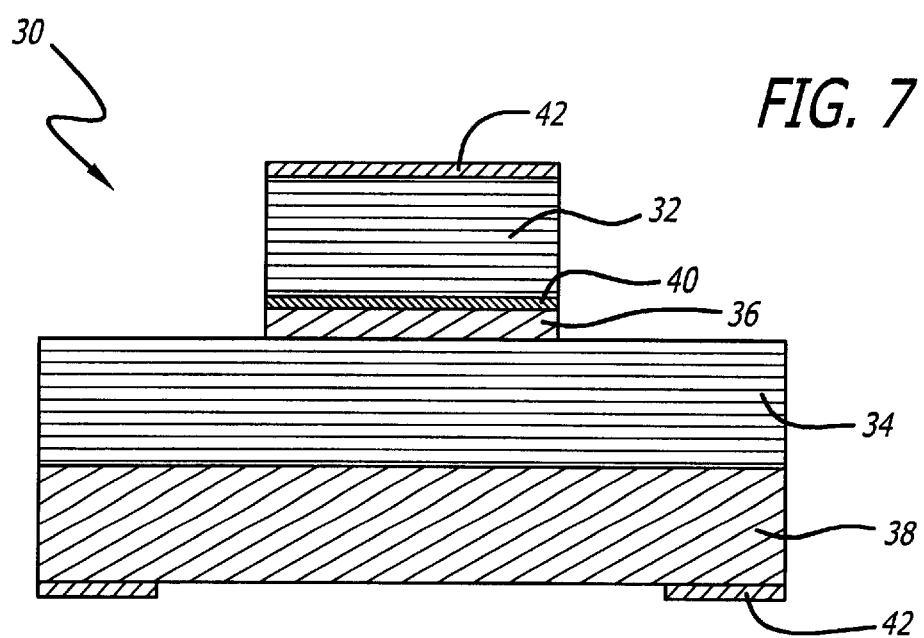
FIG. 7 is a schematic representation of a VCSEL having an Sb-based DBR.

FIG. 7 is a schematic representation of another aspect of the present invention, in which an electrically-pumped, Sb-based vertical-cavity laser 30 operating at 1.55 $\mu$m is produced in a single epitaxial growth. The laser 30 employs AlGaAsSb DBRs 32 and 34 and an AlInGaAs-based active region 36, and has a room temperature threshold current density of 1.4 kA/cm$^2$ and an external quantum efficiency of 18%. The DBRs 28 and 30 employ a plurality of layers of semiconductor material, each alternating layer having the material composition of AlGaAsSb. In another embodiment, the DBRs 28 and 30 have a plurality of layers of semiconductor material, only one of which includes the element antimony (Sb).

The VCSEL 30 is grown by a molecular beam epitaxy on an n-doped (Sn) InP substrate 38. The active region 36 includes a 1λ cavity in which five strain-compensated AlIn- GaAs quantum wells are grown. A thin, heavily-doped tunnel junction 40, using $CB_{r4}$ as the p-type dopant and Si as the n-type dopant, is placed at a standing-wave null of the mode to provide electron-hole conversion from the top n-DBR.

Figure 8:
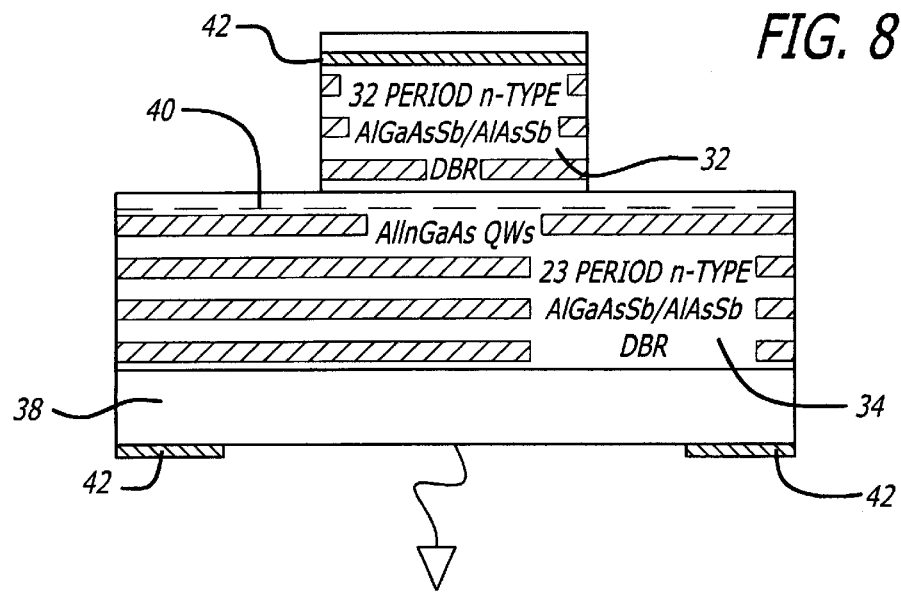
FIG. 8 is an additional schematic representation of a VCSEL having showing Sb-based DBRs of specific periods.

FIG. 8 is a schematic representation of one embodiment of the present invention in which the bottom DBR 34 includes 23 pairs of $AlAs_{0.56}Sb_{0.44}$ and $Al_{0.2}Ga_{0.8}As_{0.58}Sb_{0.42}$ λ/4-layers lattice-matched to InP. The calculated reflectivity for this mirror is 99.6%. The top DBR 32, which has a calculated reflectivity of 99.9%, includes 30 periods of the same material combination plus a phase-matching layer for a metal contact 42. Both DBRs 32 and 34 have linearly graded interfaces between the low- and high-index layers and are uniformly n-type doped with the donor tellurium (Te) using PbTe ($n \approx 10^{18}/cm^3$ in AlAsSb). Two n-type DBRs are chosen to reduce both the voltage drop and optical losses in the VCSEL.

In general the DBRs 32, 34 can include alternating layer pairs of $Al_aGa_{1-a}As_bSb_{1-b}$ which are approximately lattice-matched to InP. The subscript "a" can be greater than 0.9 in one layer of the alternating layer pairs and less than 0.3 in the other layer of the alternating layer pairs. In the higher-index layers with "a" less than 0.3, "a" should still be large enough such that the layer is substantially transparent to lasing light. Here "b" can be a positive number and preferably greater than approximately 0.5.

More specifically, the DBRs 32, 34 can consist, respectively, of preferably twenty-three and thirty-two pairs of $Al_{a1}Ga_{1-a1}As_xSb_{1-x}$ and $Al_{a2}Ga_{1-a2}As_xSb_{1-x}$ (a1>0.9, a2<0.3, x>0.5) λ/4-layers, lattice-matched to the InP cladding layers. Lattice-matching is achieved by using previously-calibrated group-V induced reflection high-energy electron diffraction oscillations and then growing at conditions with near-unity antimony incorporation rates. As an alternative, only the top cladding layer or the bottom cladding layer may be present in the VCSEL. A small amount of Ga is generally added to the AlAsSb reflecting surfaces so as to stabilize these surfaces chemically, and make them more resistive to degradation without substantially increasing their index of refraction.

The cavity mode has a reflectivity spectrum of 1.55 μm measured after growth, which is centered on a >140 nm stopband (reflectivity >99%). Other embodiments can have an approximate range between 1.3 and 1.6 microns. The top DBR 32 is then removed in order to examine the photoluminescence (PL) of the quantum wells. The PL peak is at ~1580 nm, placing the cavity mode on the broad, short-wavelength shoulder of the PL spectrum. The mode and PL peak can be aligned by lowering the operation temperature.

Pillars with diameters ranging from 10 to 100 μm are then fabricated by reactive ion etching using the top metal contact as an etch mask. Contacts may also deposited on the substrate 38 backside.

Figure 9:
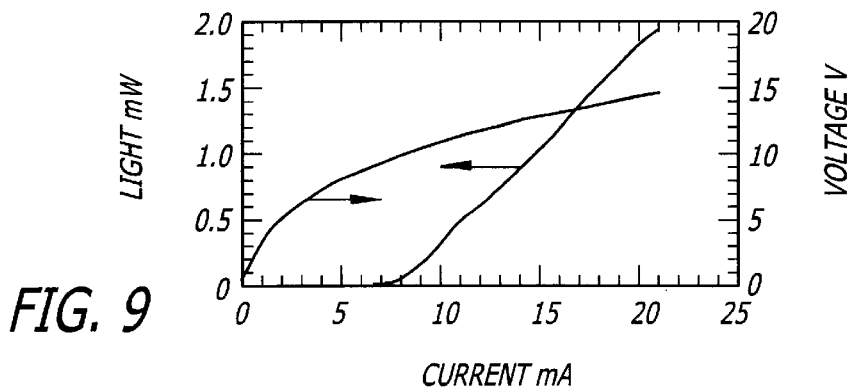
FIG. 9 is a plot of L–I and I–V for a VCSEL having an etched pillar of 25 $\mu$m

FIG. 9 is a plot of the L–I and I–V results from a VCSEL having a 25 μm diameter pillar operated in pulsed-mode at room temperature. The threshold current is 7 mA, corresponding to the current density of 1.4 $kA/cm^2$. The external differential quantum efficiency of this device was 18% and the maximum power was 2 mW. Lasing is achieved up to 45° C. with a threshold current of 15.5 mA.

FIG. 9 also shows that the devices exhibit a high voltage that most likely is attributable to both a high contact resistance in this processing run and to the DBRs which have a relatively low doping level. By increasing the doping a few periods away from the cavity or by using intra-cavity contacts, it is anticipated that this voltage drop may be reduced significantly without introducing additional optical losses.

Figure 10:
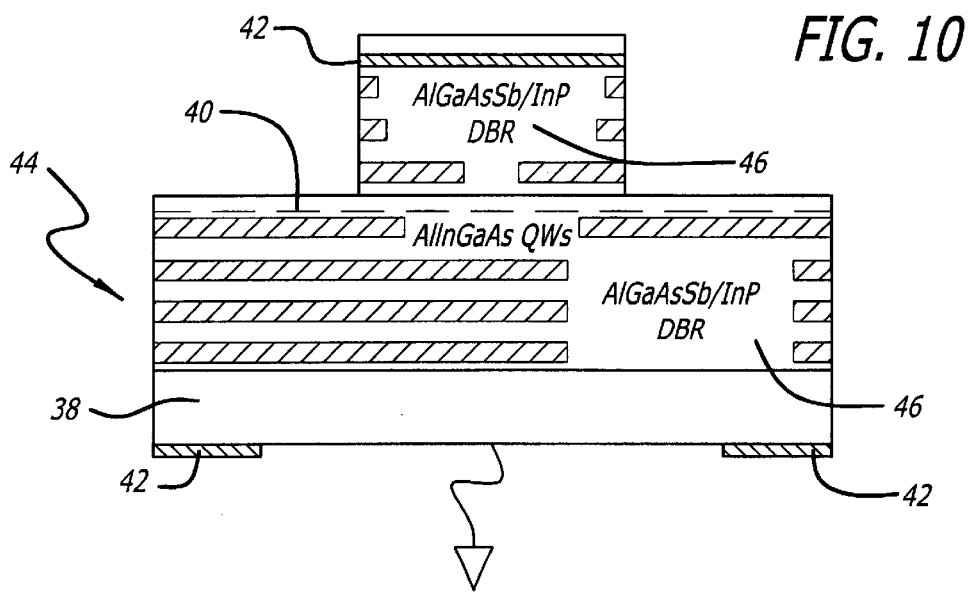
FIG. 10 is a schematic representation of a VCSEL with a DBR having an AlGaAsSb/InP material composition.

In accordance with another aspect of the present invention, FIG. 10 is schematic representation of a VCSEL 44 having DBRs 46 including InP and AlGaAsSb respectively as low-refractive index and high-refractive index quarter-wavelength layers. The DBRs 46 have alternating layers of semiconductor material, where on layer is AlGaAsSb and the next layer is InP. The introduction of InP layers in the DBRs 46 leads to numerous benefits such as easier epitaxial growth of a binary alloy, and intrinsic low thermal resistivity and high electrical conductivity of the InP material. In particular, InP has the unique property of combining a low refractive index (n=3.17) and a direct bandgap in the near-infrared ($E_\Gamma$=0.92 μm). For the 1.55 μm DBRs, this avoids carrier transfers between Γ and X valleys, existing with other low refractive index materials (AlAsSb and AlInAs).

In one embodiment, the DBRs 46 include 21 pairs of $Al_{0.1}Ga_{0.9}As_{0.52}Sb_{0.48}$/InP N-doped with tellurium (Te) at approximately $3 \times 10^{18}$ $cm^{-3}$. This value was obtained from a Hall measurement on the DBR itself, grown on a semi-insulated (SI) InP substrate, and reflects an effective doping level because of the different activation efficiencies between the quaternary alloy and InP. The DBRs are grown by solid source molecular beam epitaxy (SSMBE) using valved cracker cells for As, Sb and P species. All the AlGaAsSb layers are nominally lattice-matched on InP.

For electrical characterizations, etched mesas defined by reactive ion etching (RIE) with a mixed flow of chlorine and argon were incorporated in the VCSEL. After etching, NiAuGe contacts were deposited in order to form transmission line model (TLM) test patterns.

FIG. 11 is a flowchart of steps in the process of fabricating a DBR 46 using this aspect of the present invention. Block 48 shows the step of providing a substrate on which a DBR structure will be grown. Block 50 shows the step of determining lattice-matching conditions for AlGaAsSb material. The lattice matching conditions are determined by observing and measuring RHEED oscillations on the substrate. Because the substrate and alternating layers of the DBR structure are composed of InP, which is a binary alloy having a static lattice constant, the primary concern in lattice matching the DBR layers is the composition of the elements in the AlGaAsSb layers of the DBR structure. Each of the elements of the AlGaAsSb structure has an influence on the overall lattice constant. Al and Ga (both group III elements) have a large effect on the refractive index, so their proportions are design selections for the DBR. Therefore, given a selected amount of the group III elements, the relative amounts of As and Sb, both group V elements, must be determined to match the lattice constant with that of the InP layers and substrate. RHEED oscillations are then observed and measured to determine proper proportions of As and Sb to arrive at the appropriate lattice constant to lattice match the AlGaAsSb layers to the InP layers and to the InP substrate.

Block 52 shows the step of growing a lattice-matched AlGaAsSb layer of semiconductor material on the substrate. AlGaAsSb layers are lattice-matched to both the substrate and to the InP layers. Block 54 shows the step of growing an InP layer of semiconductor material on the substrate. Finally, Block 56 shows the step of doping the AlGaAsSb and InP layers on the substrate. The doping step occurs simultaneously with the growth of the AlGaAsSb and InP layers on the substrate, since dopants are introduced to the substrate as these semiconductor materials are being grown.

FIG. 12 is a plot of the differences in band alignment between arsenide-antimonide alloys and InP. The conduction band offset is quite important between AlAsSb and AlGaAsSb previously used. A drastic reduction of this offset can be achieved by substituting InP for AlAsSb. Another significant improvement is to avoid the scattering mechanisms encountered in the electron transport between direct and indirect bandgap materials. The InP/$Al_{0.1}Ga_{0.9}As_{0.52}Sb_{0.48}$ heterostructure thus obtained is of type II, with a barrier height of 310 meV for the electrons. According to this, conduction band offset is higher than for InGaAsP/InP (186 meV) but lower than for AlGaInAs/AlInAs (381 meV).

Figures 13, 14:
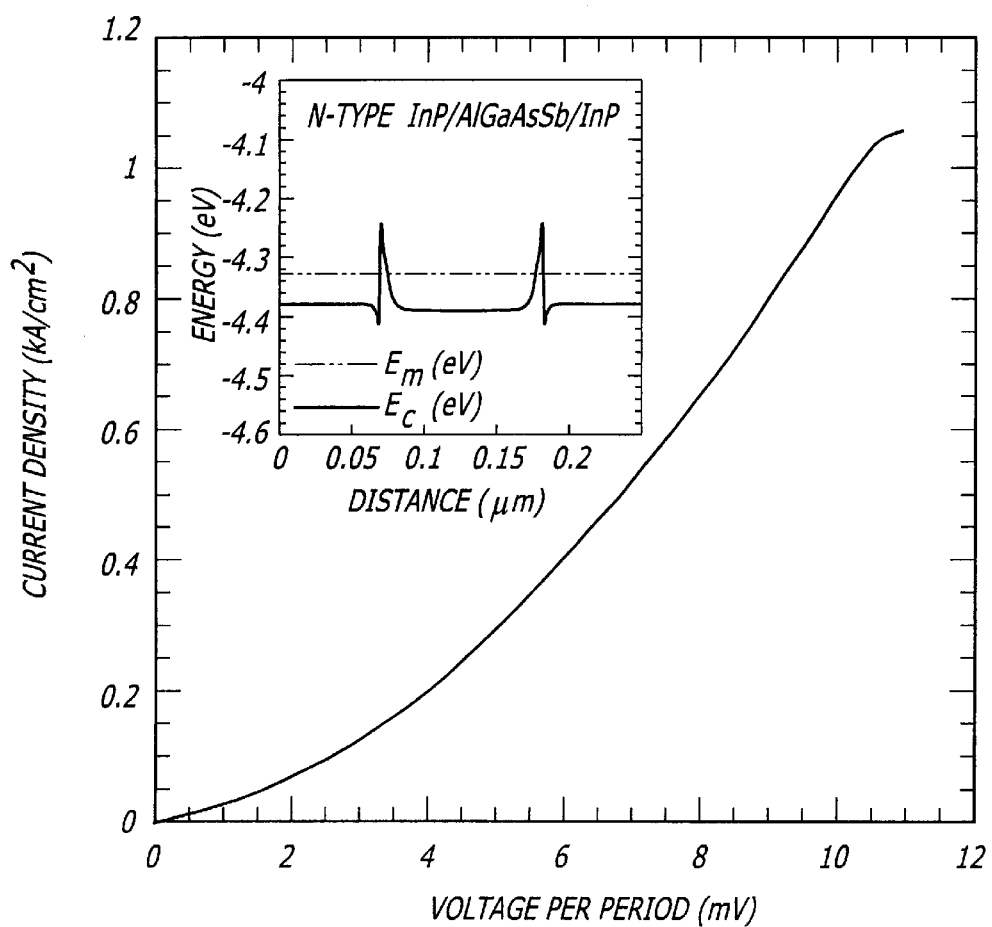
FIG. 13 is a plot of current density versus voltage characteristics of an $Al_{0.1}GaAsSb/InP$ DBR in a growth direction.
FIG. 14 is a table of thermal conductivity measurements of AsSb compounds in bulk layers and in DBRs.

FIG. 13 is a plot of the current density versus voltage characteristics of an $Al_{0.1}GaAsSb/InP$ DBR in the growth direction. As expected from the band diagram discussed above, the voltage drop is low; typically 10 mV per period is measured at a current density of 1 kA/cm². From the modeling of the conduction band, depicted in the inset of the FIG. 13, the calculated thermionic component of the current leads to a voltage of 8 mV per pair. Again, if this result is compared to other systems used on InP, the voltage in AlGaAsSb/InP is the smallest. In an actual VCSEL structure including two AlGaAsSb/InP DBRs of 25 pair each, the total voltage due to the DBRs would be only 0.5 V.

FIG. 14 is a table of thermal conductivity measurements of AsSb compounds in bulk layers and in DBRs. Generally speaking, the only lattice-matched alloys to InP are ternary and quaternary alloys, and so their thermal conductivities are limited. This comes from the phonon scattering in a lattice with different atoms. The best way to maximize the thermal properties of a DBR is to use InP. In FIG. 14, the difference between InP and ternary or quaternary alloys is clearly demonstrated. An improvement of a factor two was obtained for InP-containing DBRs. By reasoning as an equivalent electric circuit, one can deduce the relation between the thermal conductivities of the DBR and the constituting layers 1 and 2-as $$(d_1+d_2)/K_{DBR}=d_1/k_1+d_2/k_2$$

where d is the layer thickness and k the thermal conductivity.

The conductivity of the DBRs calculated from the experimental data of bulk layers is equal to the measured values, even for AlGaAsSb/AlAsSb or AlGaAsSb/InP. This indicates that phonon scattering occurs predominantly in the quaternary alloy rather than at the interfaces.

Figure 15:
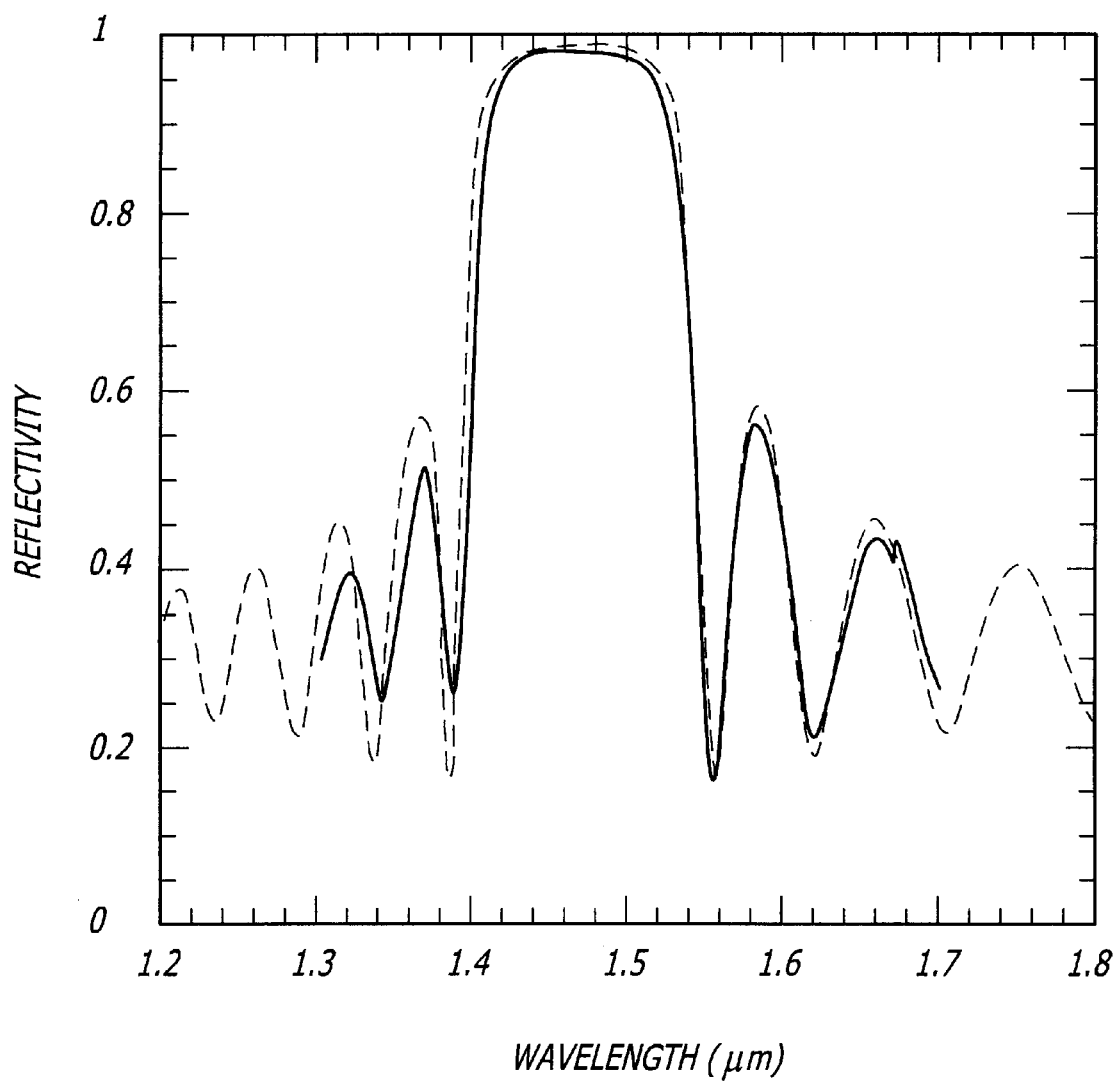
FIG. 15 is a plot of calculated and experimental spectra of a 20.5 period AlGaAsSb/InP DBR.

FIG. 15 shows the experimental and calculated reflectivity spectra. A good correlation is obtained for the high reflectivity stop-band and the higher wavelengths sidelobes. Whereas, at shorter wavelengths, we observe the incidence on the reflectivity curve of the AlGaAsSb absorption below the bandgap ($E_\Gamma$ [$Al_{0.1}Ga_{0.9}As_{0.52}Sb_{0.48}$]=1.4 $\mu$m). At the center-wavelength located at 1.47 $\mu$m, the refractive index contrast used in the calculation was 1.135 with the refractive indices, n=3.61 and n=3.18, respectively for $Al_{0.1}Ga_{0.9}As_{0.52}Sb_{0.48}$ and InP, leading to a maximum reflectivity of 0.994. One can also note the important width of the stop-band of about 100 nm.

It is to be understood that other embodiments may be utilized and structural and functional changes may be made without departing from the scope of the present invention. The foregoing descriptions of embodiments of the invention have been presented for the purposes of illustration and description. It is not intended to be exhaustive or to limit the invention to the precise forms disclosed. Accordingly, many modifications and variations are possible in light of the above teachings. For example, a distributed Bragg reflector according to the present invention may utilize alternating layers of semiconductor material having the element antimony, or it may utilize one layer of material having antimony in the mirror design. It is therefore intended that the scope of the invention be limited not by this detailed description.

What is claimed is:

1. A method of enhancing thermal properties of a distributed Bragg reflector, comprising:
   growing a high refractive index layer including aluminum gallium arsenic antimonide (AlGaAsSb) on a substrate; and
   growing a low refractive index layer including indium phosphide (InP) on the substrate, the high refractive index layer being lattice-matched to the low refractive index layer to form a layered semiconductor material, wherein use of InP reduces thermal resistivity in the layered semiconductor material.

2. The method of claim 1, wherein the layered semiconductor material forms a reflective device.

3. The method of claim 1, wherein the substrate is InP.

4. The method of claim 1, wherein the layers are comprised of alternating layer pairs of $Al_aGa_{1-a}As_bSb_{1-b}$ which are approximately lattice-matched to InP, and where "a" and "b" indicate relative proportions of atoms.

5. The method of claim 4, wherein "a" is greater than 0.9 and less than 0.9 in alternating layers.

6. The method of claim 4, wherein "a" is less than 0.3 and greater than 0.3 in alternating layers.

7. The method of claim 4, wherein "a" is less than 0.3 and greater than 0.9 in alternating layers.

8. The method of claim 4, wherein "a" is less than 0.3 in alternating layers and "a" is large enough such that the layer is substantially transparent to lasing light.

9. The method of claim 3, wherein a first layer of AlGaAsSb is lattice-matched to the InP substrate.

10. The method of claim 1, further comprising doping the layered semiconductor material with tellurium.

11. The method of claim 1, wherein the use of InP increases electrical conductivity of the multi-layered semiconductor material.

12. The method of claim 1, further comprising a plurality of AlGaAsSb layers and a plurality of InP layers, the plurality of AlGaAsSb layers and the plurality of InP layers forming the layered semiconductor material.

13. The method of claim 1, wherein the InP layer and the AlGaAsSb layer are grown on the substrate using solid state molecular beam epitaxy.

14. The method of claim 13, further comprising doping the layered semiconductor material with tellurium (Te) using PbTe as a source material for the molecular beam epitaxy.

15. A method of fabricating a distributed Bragg reflector, comprising:
   providing a substrate, a high refractive index aluminum gallium arsenic antimonide (AlGaAsSb) layer of semiconductor material and a low refractive index, indium phosphide (InP) layer of semiconductor material; and
   growing the AlGaAsSb layer and the InP layer on the substrate to form a reflective device.

16. The method of claim 15, wherein the high refractive index layer is lattice-matched to the low refractive index layer to form a layered semiconductor material.

17. The method of claim 15, wherein the substrate is InP.

18. The method of claim 15, wherein the layers are comprised of alternating layer pairs of $Al_aGa_{1-a}As_bSb_{1-b}$ which are approximately lattice-matched to InP, and where "a" and "b" indicate relative proportions of atoms.

19. The method of claim 18, wherein "a" is greater than 0.9 and less than 0.9 in alternating layers.

20. The method of claim 18, wherein "a" is less than 0.3 and greater than 0.3 in alternating layers.

21. The method of claim 18, wherein "a" is less than 0.3 and greater than 0.9 in alternating layers.

22. The method of claim 18, wherein "a" is less than 0.3 in alternating layers and "a" is large enough such that the layer is substantially transparent to lasing light.

23. The method of claim 17, wherein a first layer of AlGaAsSb is lattice-matched to the InP substrate.

24. The method of claim 16, further comprising doping the layered semiconductor material with tellurium.

25. The method of claim 16, wherein the use of InP decreases thermal resistivity of the layered semiconductor material.

26. The method of claim 16, wherein the use of InP increases electrical conductivity of the layered semiconductor material.

27. The method of claim 15, further comprising a plurality of AlGaAsSb layers and a plurality of InP layers, the plurality of AlGaAsSb layers lattice-matched to the plurality of InP layers to form a layered semiconductor material, wherein growing the plurality of AlGaAsSb layers and the plurality of InP layers forms a reflective device.

28. The method of claim 15, further comprising growing the InP layer and the AlGaAsSb layer using solid state molecular beam epitaxy.

29. A distributed Bragg reflector for use in a vertical cavity surface emitting laser, comprising a layered semiconductor material on a substrate, the layered semiconductor material having at least one indium phosphide (InP) layer and at least one aluminum gallium arsenic antimonide (AlGaAsSb) layer lattice-matched to the InP layer.

30. The distributed Bragg reflector of claim 29, wherein the layered semiconductor material forms a reflective device.

31. The distributed Bragg reflector of claim 29, wherein the substrate is InP.

32. The distributed Bragg reflector of claim 29, wherein the layers are comprised of alternating layer pairs of $Al_aGa_{1-a}As_bSb_{1-b}$ which are approximately lattice-matched to InP, and where "a" and "b" indicate relative proportions of atoms.

33. The distributed Bragg reflector of claim 32, wherein "a" is greater than 0.9 and less than 0.9 in alternating layers.

34. The distributed Bragg reflector of claim 32, wherein "a" is less than 0.3 and greater than 0.3 in alternating layers.

35. The distributed Bragg reflector of claim 32, wherein "a" is less than 0.3 and greater than 0.9 in alternating layers.

36. The distributed Bragg reflector of claim 32, wherein "a" is less than 0.3 in alternating layers and "a" is large enough such that the layer is substantially transparent to lasing light.

37. The distributed Bragg reflector of claim 31, wherein a first layer of AlGaAsSb is lattice-matched to the InP substrate.

38. The distributed Bragg reflector of claim 29, wherein the layered semiconductor material is N-doped with tellurium.

39. The distributed Bragg reflector of claim 29, further comprising a plurality of AlGaAsSb layers and a plurality of InP layers, the plurality of AlGaAsSb layers lattice-matched to the plurality of InP layers to form the layered semiconductor material, wherein growing the plurality of AlGaAsSb layers and the plurality of InP layers forms a reflective device.

40. The distributed Bragg reflector of claim 39, wherein the layered semiconductor material is N-doped with tellurium.

41. The method of claim 29, wherein the use of InP decreases thermal resistivity of the layered semiconductor material.

42. The method of claim 29, wherein the use of InP increases electrical conductivity of the layered semiconductor material.

43. The distributed Bragg reflector of claim 29, wherein the InP layer and the AlGaAsSb layer are epitaxially grown on the substrate.

44. A method of enhancing thermal properties of a distributed Bragg reflector, comprising:

providing a substrate and a layered semiconductor material grown on the substrate, the layered semiconductor material having a plurality of high refractive index layers each including aluminum gallium arsenic antimonide (AlGaAsSb) and a plurality of low refractive index layers each including indium phosphide (InP); and reducing thermal resistivity in the layered semiconductor material by lattice-matching the AlGaAsSb layers to the InP layers, wherein the InP layers are introduced into the semiconductor material as the AlGaAsSb layers are grown on the substrate.

45. The method of claim 44, wherein the InP layers and the AlGaAsSb layers are epitaxially grown on the substrate.

46. The method of claim 44, wherein the substrate is InP.

47. The method of claim 45, wherein the layers are comprised of alternating layer pairs of $Al_aGa_{1-a}As_bSb_{1-b}$ which are approximately lattice-matched to InP, and where "a" and "b" indicate relative proportions of atoms.

48. The method of claim 47, wherein "a" is greater than 0.9 and less than 0.9 in alternating layers.

49. The method of claim 47, wherein "a" is less than 0.3 and greater than 0.3 in alternating layers.

50. The method of claim 47, wherein "a" is less than 0.3 and greater than 0.9 in alternating layers.

51. The method of claim 47, wherein "a" is less than 0.3 in alternating layers and "a" is large enough such that the layer is substantially transparent to lasing light.

52. The method of claim 46, wherein a first layer of AlGaAsSb is lattice-matched to the InP substrate.

53. The method of claim 44, wherein the layered semiconductor material forms a reflective device.

54. The method of claim 44, further comprising doping the layered semiconductor material with tellurium.

55. The method of claim 44, wherein the use of InP layers decreases thermal resistivity of the layered semiconductor material.

56. The method of claim 44, wherein the use of InP layers increases electrical conductivity of the layered semiconductor material.

57. A distributed Bragg reflector for use in a vertical cavity surface emitting laser, comprising a layered semiconductor material on a substrate, the layered semiconductor material having a binary alloy including at least one indium phosphide (InP) layer and a quarternary alloy including at least one aluminum gallium arsenic antimonide (AlGaAsSb) layer lattice-matched to at least one InP layer.

* * * * *

UNITED STATES PATENT AND TRADEMARK OFFICE
CERTIFICATE OF CORRECTION

PATENT NO.   : 6,631,154 B2
DATED        : October 7, 2003
INVENTOR(S)  : Larry A. Coldren et al.

It is certified that error appears in the above-identified patent and that said Letters Patent is hereby corrected as shown below:

Column 1,
Line 53, please delete the word "surfave", and replace with word -- surface -- to read, -- cavity surface emitting laser --;

Column 2,
Line 64, please delete the word "antinomy" and replace with the word "antimony" to read, -- antimony (Sb) atoms present in the substrate --;

Column 3,
Line 8, please delete the word "reflect", and replace with the word "reflector" to read, -- reflector for use in a VCSEL --;
Line 32, please delete the word "having" to read, -- VCSEL showing Sb-based DBRs --;
Line 34, please add a semicolon at the end of the sentence to read -- etched pillar of 25 um; --;

Column 4,
Line 30, please delete the word "valve", and replace with the word -- value -- to read, -- value settings for proper Sb incorporation --;

Column 5,
Line 35, please delete the word "Å/s", and replace with the word -- Å -- to read, -- growth rates are typically on the order of a few Å and the --;

Column 6,
Line 45, please insert a comma after the word "comparison" to read -- As a comparison, the photoluminescence signal --.
Line 46, please delete the word "a", before the word "for", and delete the hyphen between the words "Be" and "doped" to read, -- signal observed for 10.5 periods Be doped AlGaInAs/ --;

Column 7,
Line 53, please insert the word -- be -- between the words "also" and "deposited" to read -- Contacts may also be deposited --;

Column 8,
Line 9, please delete the word "on", and replace with the word "one" to read -- where one layer is --;
Line 21, please delete the word "N-doped", and replace with the word "n-doped" to read, -- n-doped with tellerium (Te) --;

UNITED STATES PATENT AND TRADEMARK OFFICE
CERTIFICATE OF CORRECTION

PATENT NO. : 6,631,154 B2
DATED : October 7, 2003
INVENTOR(S) : Larry A. Coldren et al.

It is certified that error appears in the above-identified patent and that said Letters Patent is hereby corrected as shown below:

Column 9,
Line 40, please delete the hyphen after the number "2" and before the word "as" to read, -- constituting layers 1 and 2 as --;

Column 10,
Line 61, please delete the word "phospide", and replace with the word "phosphide" to read, -- phosphide (InP) layer of semiconductor material --.

Signed and Sealed this

Twenty-first Day of September, 2004

JON W. DUDAS
*Director of the United States Patent and Trademark Office*